(12) United States Patent
Mashimo et al.

(10) Patent No.: US 8,450,837 B2
(45) Date of Patent: May 28, 2013

(54) CIRCUIT DEVICE HAVING AN IMPROVED HEAT DISSIPITATION, AND THE METHOD OF MANUFACTURING THE SAME

(75) Inventors: Shigeki Mashimo, Maebashi (JP); Fumio Horiuchi, Ashikaga (JP); Kiyoaki Kudo, Gunma (JP); Akira Sakurai, Tatebayashi (JP); Yuhki Inagaki, Kumagaya (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 0 days.

(21) Appl. No.: 13/240,870

(22) Filed: Sep. 22, 2011

(65) Prior Publication Data

US 2012/0074552 A1    Mar. 29, 2012

(30) Foreign Application Priority Data

Sep. 24, 2010  (JP) .................................. 2010-213693

(51) Int. Cl.
*H01L 23/495* (2006.01)
*H01L 23/60* (2006.01)

(52) U.S. Cl.
USPC ............ 257/676; 257/E23.037; 257/E21.506; 257/784; 257/786; 257/666; 257/686; 257/685; 257/723; 257/712; 257/713; 257/717; 257/720; 257/728; 257/777

(58) Field of Classification Search
USPC .................. 257/676, E23.037, E21.506, 784, 257/786, 666, 686, 685, 723, 712, 713, 717, 257/720, 728, 777
See application file for complete search history.

(56) References Cited

U.S. PATENT DOCUMENTS

| 4,827,328 | A | * | 5/1989 | Ozawa et al. | 361/765 |
|---|---|---|---|---|---|
| 5,483,217 | A | * | 1/1996 | Nagasaka et al. | 338/252 |
| 7,957,158 | B2 | * | 6/2011 | Takakusaki et al. | 361/808 |
| 8,106,496 | B2 | * | 1/2012 | Ramakrishna et al. | 257/685 |
| 2005/0161251 | A1 | * | 7/2005 | Mori et al. | 174/250 |
| 2005/0213308 | A1 | * | 9/2005 | Suzuki et al. | 361/803 |
| 2007/0257343 | A1 | * | 11/2007 | Hauenstein et al. | 257/676 |
| 2008/0099922 | A1 | * | 5/2008 | Sakamoto | 257/758 |
| 2008/0119065 | A1 | * | 5/2008 | Takakusaki et al. | 439/74 |
| 2009/0086431 | A1 | * | 4/2009 | Sakamoto et al. | 361/695 |
| 2009/0086454 | A1 | * | 4/2009 | Sakamoto et al. | 361/796 |
| 2009/0086455 | A1 | * | 4/2009 | Sakamoto et al. | 361/796 |

(Continued)

FOREIGN PATENT DOCUMENTS

| JP | 5-102645 | | 4/1993 |
|---|---|---|---|
| JP | 10-135380 | * | 5/1998 |
| JP | 2006-73591 A | * | 3/2006 |

OTHER PUBLICATIONS

Korean Office Action dated Nov. 9, 2012, directed to Korean Patent Application No. 10-2011-0096143; 4 pages.

*Primary Examiner* — A O Williams
(74) *Attorney, Agent, or Firm* — Morrison & Foerster LLP

(57) ABSTRACT

In a hybrid integrated circuit device, a circuit board on which an island portion of a lead is fixedly attached and a control board on which a control element and the like are mounted are disposed in an overlapping manner. The circuit board and the control board are integrally encapsulated with an encapsulating resin. A transistor disposed on an upper surface of the circuit board and a control element mounted on an upper surface of the control board are also covered by the encapsulating resin. Thus, a module in which an inverter circuit and a control circuit are integrally encapsulated with resin is provided.

12 Claims, 9 Drawing Sheets

U.S. PATENT DOCUMENTS

| | | | |
|---|---|---|---|
| 2009/0103276 A1* | 4/2009 | Sakamoto et al. | 361/792 |
| 2009/0119915 A1* | 5/2009 | Usui et al. | 29/852 |
| 2009/0129038 A1* | 5/2009 | Takakusaki et al. | 361/772 |
| 2009/0135572 A1* | 5/2009 | Takakusaki et al. | 361/803 |
| 2010/0078675 A1* | 4/2010 | Kudo et al. | 257/140 |
| 2012/0021568 A1* | 1/2012 | Mino et al. | 438/127 |
| 2012/0075816 A1* | 3/2012 | Mashimo et al. | 361/760 |

* cited by examiner

CIRCUIT DEVICE HAVING AN IMPROVED HEAT DISSIPITATION, AND THE METHOD OF MANUFACTURING THE SAME

This application claims priority from Japanese Patent Application Number JP 2010-213693 filed on Sep. 24, 2010, the content of which is incorporated herein by reference in its entirety.

BACKGROUND OF THE INVENTION

1. Field of the Invention

The invention relates to a circuit device and a method for manufacturing the same, and more particularly relates to a circuit device incorporating a power semiconductor element that performs switching of a large current and a control element for controlling the semiconductor element and to a method for manufacturing the same.

2. Description of the Related Art

A structure of a conventional hybrid integrated circuit device 100 is described with reference to FIG. 9. This technology is described for instance in Japanese Patent Application Publication No. Hei 5-102645. A conductive pattern 103 is formed on a surface of a rectangular substrate 101 with an insulative layer 102 interposed therebetween. A certain electrical circuit is formed by fixedly attaching circuit elements on the conductive pattern 103. Here, a semiconductor element 105A and a chip element 105B as the circuit elements are connected to the conductive pattern 103. Leads 104 are connected to pads 109 each formed of a part of the conductive pattern 103 at a peripheral portion of the substrate 101 and function as external terminals. An encapsulating resin 108 has a function of encapsulating the electrical circuit formed on the surface of the substrate 101.

The semiconductor element 105A is a power element through which a large current of about several to several hundreds of amperes flows for example and thus generates an extremely large amount of heat. Thus, the semiconductor element 105A has been placed on an upper portion of a heat sink 110 placed on the conductive pattern 103. The heat sink 110 is made of a piece of metal such as copper having a size of about length×width×thickness=10 mm×10 mm×1 mm for example.

The hybrid integrated circuit device 100 having the structure incorporates, for example, an inverter circuit that generates a large amount of heat during operation. Still, the large amount of heat generated when the inverter circuit converts direct-current power of a large current into alternate-current power is favorably radiated outside through the substrate 101.

However, for the hybrid integrated circuit device 100 having the structure, a control element for controlling switching of the semiconductor element 105A needs to be prepared separately from the hybrid integrated circuit device 100 and this leads to a high cost. The control element may be mounted on the upper surface of the circuit board 101 together with the semiconductor element 105A. Unfortunately, in this structure, the heat generated by the semiconductor element 105A may be transmitted to the control element through the substrate 101 having an excellent thermal conductivity. Thus, the control element may be overheated and malfunction.

In addition, to form a circuit such as the inverter circuit for converting a large current on the upper surface of the substrate 101, the conductive pattern 103 needs to be wide to secure a current capacity. Thus, downsizing of the hybrid integrated circuit device 100 is hindered.

SUMMARY OF THE INVENTION

The present invention has been made in view of the above problems and a main object of the preset invention is to provide a circuit device with a small size and excellent heat dissipation and a method of manufacturing the same.

A circuit device according to the present invention includes: a first substrate; a lead comprising a lead portion and an island portion which is attached to an upper surface of the first substrate; a first circuit element mounted on the island portion of the lead; a second substrate disposed above and overlapping the first substrate; a second circuit element mounted on the second substrate so as to be electrically connected to the first circuit element through the lead; and an encapsulating resin covering the first substrate, the second substrate, the first circuit element, the second circuit element and the island portion, the lead portion of the lead not being covered by the encapsulating resin.

A circuit device according to the present invention includes: a first substrate having a first side and a second side; a plurality of first leads disposed along the first side of the first substrate and each comprising a lead portion and an island portion which is attached to an upper surface of the first substrate; a plurality of first circuit elements mounted on the island portions of the first leads; a second substrate disposed above and overlapping the first substrate; a plurality of second lead disposed along the second side of the first substrate; a plurality of second circuit elements mounted on the second substrate so as to be electrically connected to corresponding first circuit elements through the second leads; and an encapsulating resin covering the first substrate, the second substrate, the first circuit elements, the second circuit elements and the island portions, the lead portions of the first leads not being covered by the encapsulating resin.

A method for manufacturing a circuit device according to the present invention includes the steps of: providing a lead frame comprising a plurality of leads, some of the leads comprising respective island portions; mounting a first circuit element on an upper surface of each of the island portions; attaching lower surfaces of the island portions to an upper surface of a first substrate; placing a second substrate on which second circuit elements are mounted over the first substrate so that the second substrate is mechanically supported by the leads; and encapsulating the first substrate, the first circuit elements, the second substrate and the second circuit elements by a resin.

BRIEF DESCRIPTION OF THE DRAWINGS

FIG. 1A is a perspective view and FIG. 1B is a cross-sectional view.

FIG. 2A is a plan view showing a structure of leads and FIG. 2B is a plan view of a control board.

FIG. 5A is a circuit diagram of an inverter circuit to be incorporated. FIG. 5B is an extracted plan view of the leads. FIG. 5C is a cross sectional view showing the lead.

FIG. 6A is a plan view.

FIG. 7 is a diagram showing the method for manufacturing the circuit device according to the preferred embodiment of the invention.

FIG. 8A is a plan view. FIG. 8B is a cross-sectional view.

DESCRIPTION OF THE INVENTION

First of all, a structure of a hybrid integrated circuit device 10 as an example of a circuit device is described with reference to FIGS. 1 to 5.

Figure 1:
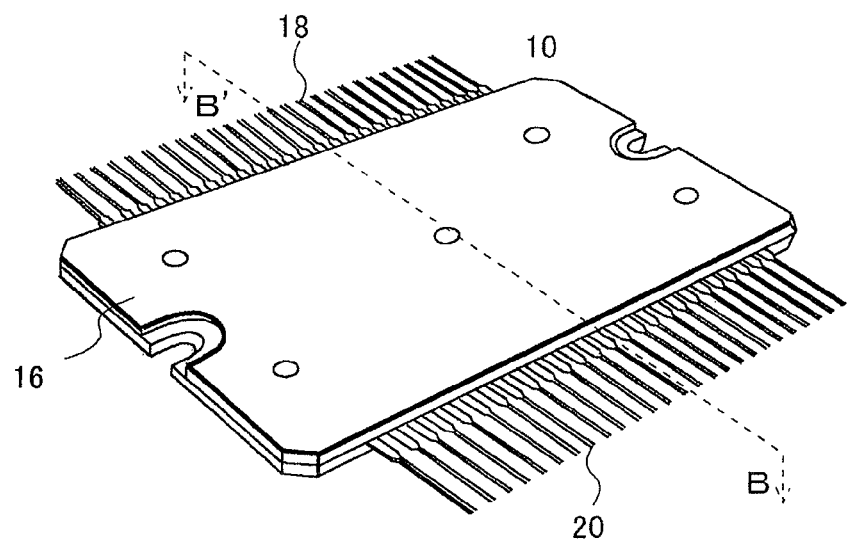
FIG. 1 is a diagram showing a circuit device according to a preferred embodiment of the invention.
Figure 1:
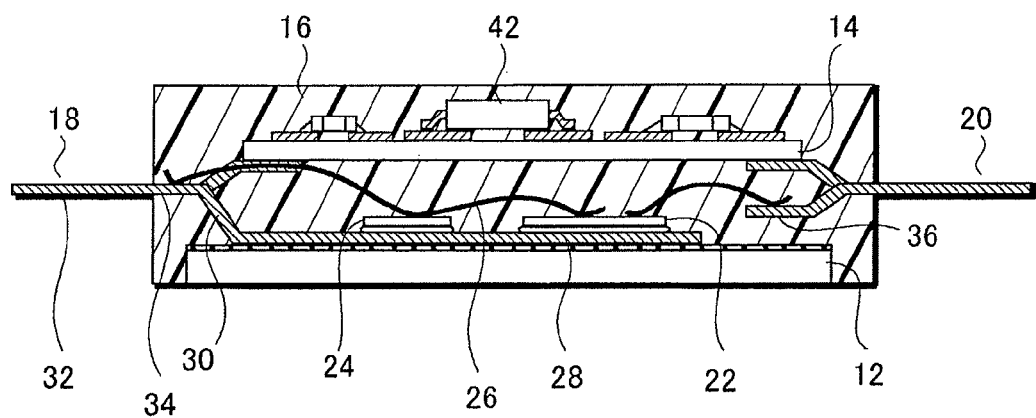

The structure of the hybrid integrated circuit device 10 according to this embodiment is described with reference to FIG. 1. FIG. 1A is a perspective view showing the hybrid integrated circuit device 10 as viewed from an obliquely upper direction. FIG. 1B is a cross-sectional view of the hybrid integrated circuit device 10.

Referring to FIG. 1A and FIG. 1B, in the hybrid integrated circuit device 10, a circuit board 12 (first substrate) on which a circuit element (first circuit element) such as a transistor 22 is disposed and a control board (second substrate) on which a control element 42 (second circuit element) for controlling the transistor 22 and the like are mounted are disposed in an overlapping manner while being integrally encapsulated by an encapsulating resin 16. The transistor 22 disposed on the upper surface of the circuit board 12 and the control element 42 mounted on the upper surface of the control board 14 are also covered by the encapsulating resin 16. The circuit elements disposed on the circuit board 12 and the control board 14 are connected to the outside through leads 18 and 20.

The circuit board 12 is a metal substrate mainly made of metal such as aluminum (Al) or copper (Cu). Specifically, the circuit board 12 has a size of about length×width×thickness=30 mm×15 mm×1.5 mm for example. When a substrate made of aluminum is used as the circuit board 12, both main surfaces of the circuit board 12 are subjected to alumite treatment. Here, the upper and the side surfaces of the circuit board 12 are covered with the encapsulating resin 16 and the lower surface is exposed to the outside. Thus, a heat sink can be brought into contact with the exposed lower surface of the circuit board 12, whereby the heat dissipation is improved. Alternatively, the lower surface of the circuit board 12 may be covered with the encapsulating resin 16 to secure moisture resistance and withstand voltage.

The control board 14 is a substrate made of an inexpensive insulative material such as a glass epoxy substrate. A conductive pattern having a thickness of about 50 μm is formed on the upper surface or both main surfaces of the control board 14. The control element 42 for controlling the transistor 22 disposed on the circuit board 12 and passive elements such as a chip resistor and a chip capacitor are disposed on the control board 14. These elements operate with an amount of generated heat small enough to be handled by the control board 14 made of a material having poor heat dissipation. In FIG. 1B, the control element 42, which is an LSI, is mounted on the upper surface of the control board 14 in a form of a resin encapsulated package. Instead, the control element 42 may be mounted on the upper surface of the control board 14 in a form of a bare chip.

Referring to FIG. 1B, the leads 18 and 20 are respectively provided on the left and the right sides in the drawing. The leads 18 and 20 not only function as external terminals of the device, but also function to mechanically support the circuit board 12 and the control board 14 in manufacturing steps. Furthermore, the lead 20 serves as a part of a path electrically connecting the transistor 22 and the like disposed on the upper surface of the circuit board 12 and the control element 42 disposed on the upper surface of the control board 14. Here, the leads are led out from two opposite side surfaces of the encapsulating resin 16 to the outside. Instead, multiple leads may be led out from a single side surface or four side surfaces.

A plurality of the leads 18 are provided along one side of the circuit board 12. The leads 18 include leads for mechanically supporting the control board 14 and leads on which a circuit element such as the transistor 22 is mounted. Referring to FIG. 1B, the lead 18 includes an island portion 28, a slope portion 30, a bonding portion 34 and a lead portion 32, in this order from the inner side. The transistor 22 and a diode 24 are fixedly attached on the upper surface of the island portion 28 with a conductive adhesive such as solder. The lower surface of the island portion 28 is fixedly attached on the upper surface of the circuit board 12. Thus, the heat generated by the transistor 22 and the diode 24 during operation is favorably radiated outside through the island portion 28 and the circuit board 12. Providing the slop portion 30 in an intermediate portion of the lead 18 separates the left upper end of the circuit board 12 from the lead 18 and thus prevents short circuiting of the circuit board 12 and the lead 18. The bonding portion 34 is a portion connected to the transistor 22 and the diode 24 through a fine metal wire 26 (an aluminum wire having a diameter in a range from 20 μm to 500 μm, for example). A connection structure through the metal wire 26 is described later with reference to FIG. 5B.

Some of the leads 18 are subjected to bending processing to have an inner end portion extend upward. The control board 14 is supported by the end portions of the processed leads 18. The detail of this portion is similar to a structure described later with reference to FIG. 4.

A plurality of the leads 20 are provided at positions opposite to those of the leads 18. A bonding portion 36 provided on the inner side of the lead 20 is electrically connected to the transistor 22 mounted on the island portion 28 of the lead 18. The lead 20 is branched at the inner end portion with one branch upwardly bent to mechanically support the control board 14.

The leads 18 and the leads 20 have different functions. Specifically, the transistor 22 and the diode 24 are mounted on the lead 18 provided on the left side of FIG. 1B. A direct current to be converted by an inverter circuit including the elements and an alternate current obtained by the conversion pass through the lead 18. Meanwhile, the lead 20 on the right side of the drawing has a function to connect a control electrode of the transistor 22 disposed on the upper surface of the circuit board 12 with the control element 42 mounted on the control board 14.

Structures of the leads 18 and 20 are described with reference to FIG. 2A. Referring to the figure, leads 18A to 18J and leads 20A to 20L are disposed opposite to each other.

Of the leads 18A to 18J, the leads 18A and 18J disposed at the respective ends are leads for mechanically supporting the control board 14 shown in FIG. 1B. The upper end potion thereof in the drawing is connected to the lower surface of the control board 14. The lead 18B is a lead through which a direct current is supplied from the outside. A resistor 45 for detecting a current value is disposed between the leads 18B and 18C.

Transistors and diodes constituting a three phase inverter circuit are provided on the upper surfaces of the leads 18D to 18I. This is described in detail later with reference to FIG. 5.

Of the leads 20A to 20L, the leads 20A and 20L disposed on respective ends are leads for mechanically supporting the control board 14. The leads 20C and 20D are respectively connected to the leads 18C and 18D through the metal wires 26 and are used for detecting a current value.

The leads 20F to 20J are connected to control electrodes of the transistors mounted on the leads 18D to 18I. For example, the inner end of the lead 20E is branched into the bonding portion 36 and a supporting portion 38. The bonding portion 36 is connected to the control electrode of the transistor mounted on the lead 18D through the fine metal wire 26. The supporting portion 38 is connected to the control board 14 (see FIG. 1B). Thus, the transistor mounted on the lead 18D and the control element 42 mounted on the control board 14 are electrically connected to each other through the lead 20E. The structure in which the supporting portion 38 of the lead 20E and the control board 14 are connected is described later with reference to FIG. 4.

FIG. 2B is a plan view of the control board 14 disposed on the upper side of the leads. Referring to the figure, a conductive pattern 50 of a certain shape is formed on the upper surface of the control board 14. The control element 42 and a passive element such as a chip element are connected to the conductive pattern 50.

Figure 2:
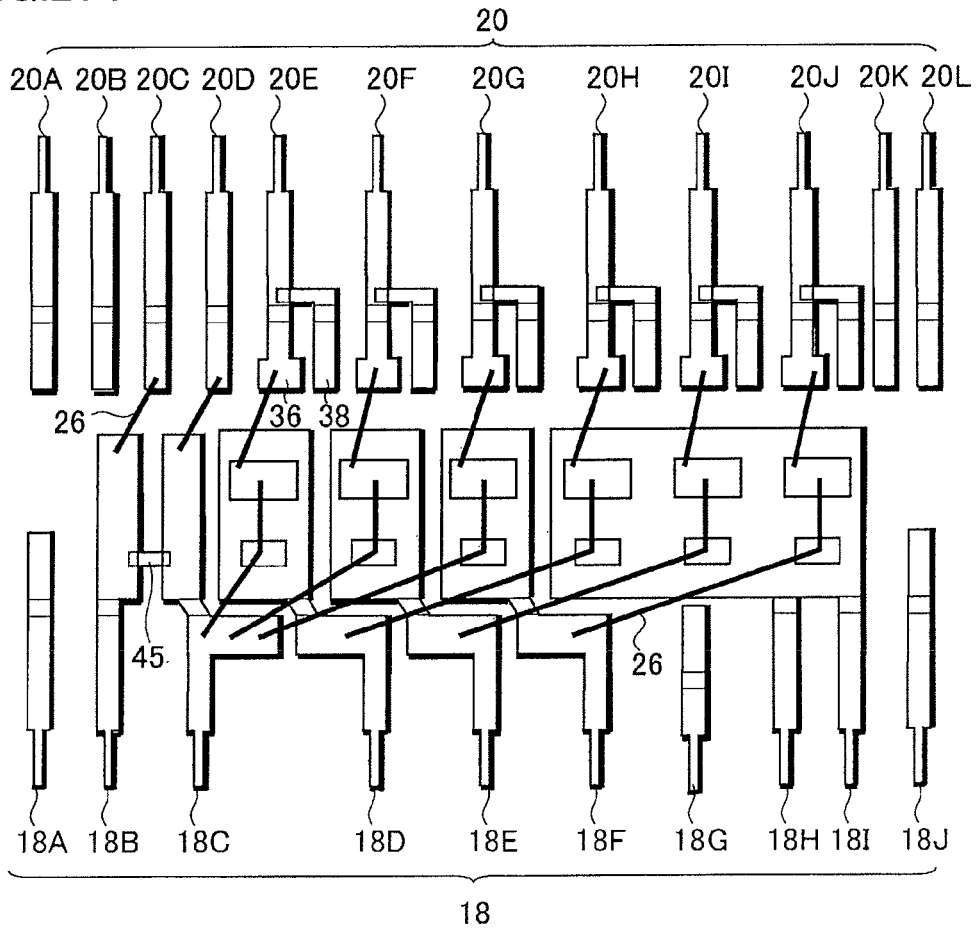
FIG. 2 is a plan view of the circuit device according to the preferred embodiment of the invention.
Figure 2:
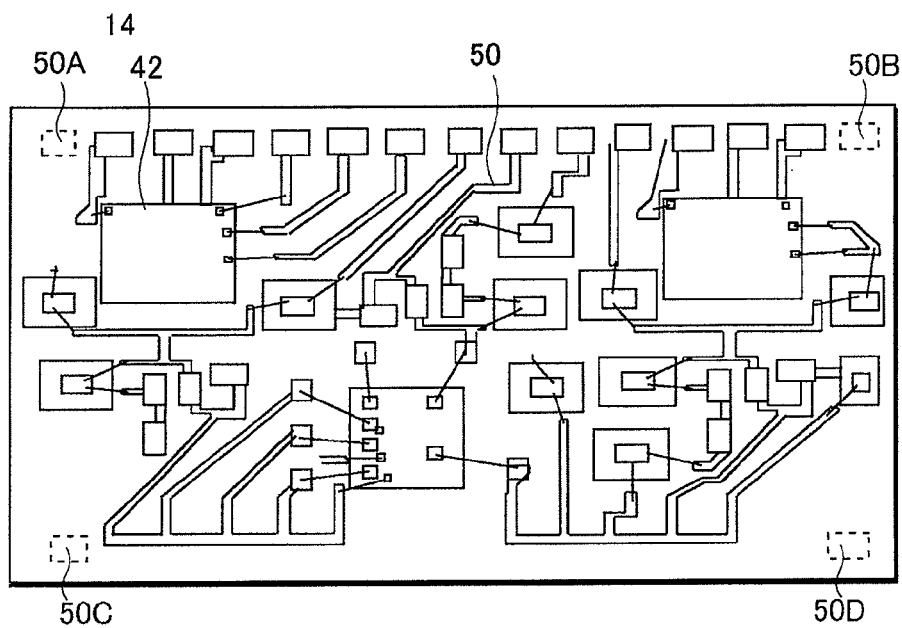
Figure 3:
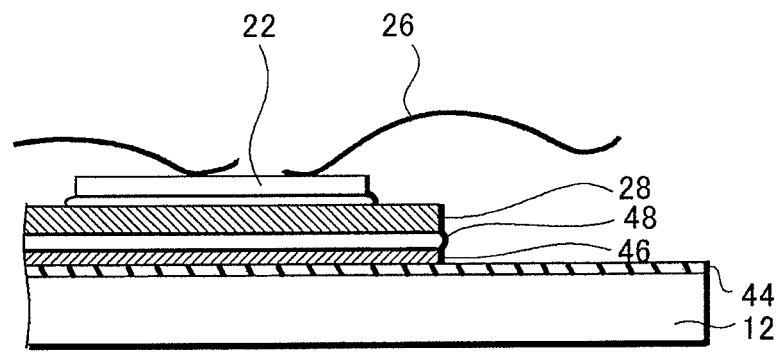
FIGS. 3A and 3B are cross-sectional views partially showing the circuit device according to the preferred embodiment of the invention.
Figure 3:
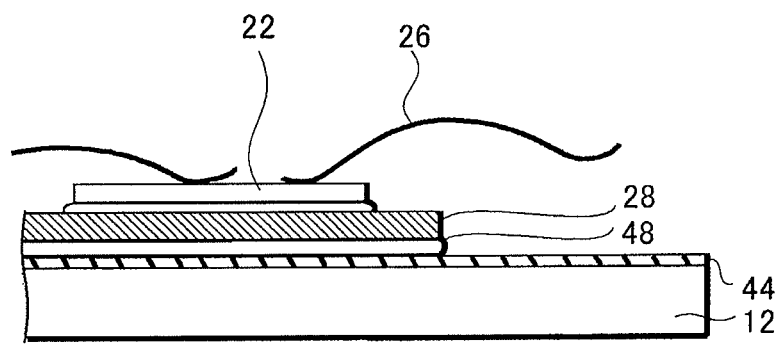

A plurality of pads are provided along the upper side of the control board 14 in the drawing. Of the pads, pads 50A and 50B disposed on the back surface at respective end portions are pads on which the leads 20A and 20L shown in FIG. 2 are respectively fixedly attached. The pads 50A and 50B are used for the connection with the leads and are so-called dummy pads through which no electrical signals pass. The pads provided at the intermediate portion are respectively connected to the leads 20B to 20J shown in FIG. 2A and serve as pads through which control signals pass.

Pads 50C and 50D are provided on respective end portions of a lower side of the control board in the drawing. These pads are pads to which the end portions of the leads 18A and 18J shown in FIG. 2A are respectively connected and used for mechanically supporting the control board 14.

Figure 4:
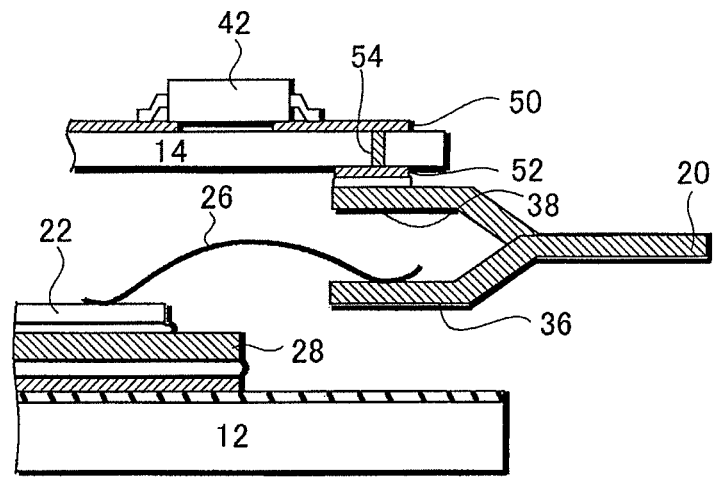
FIGS. 4A and 4B are cross-sectional views partially showing the circuit device according to the preferred embodiment of the invention.
Figure 4:
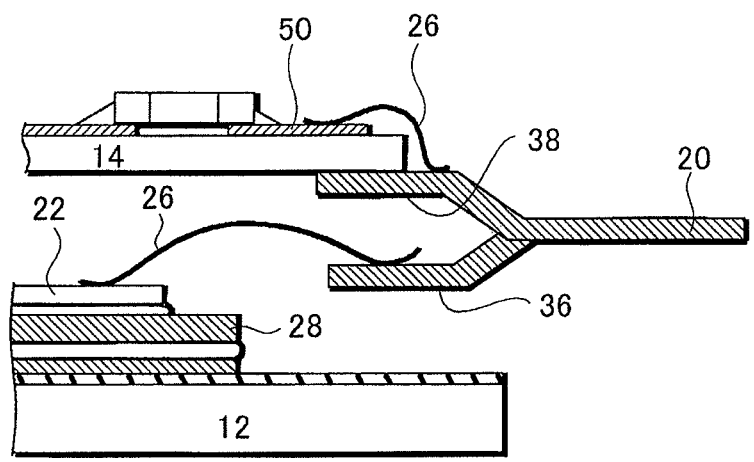

A structure in which the leads are fixedly attached on the pads are described later with reference to FIG. 4.

Structures in which the island portion 28 of the lead is fixedly attached on the upper surface of the circuit board 12 is described with reference to cross-sectional views of FIG. 3A and FIG. 3B.

Referring to FIG. 3A, the upper surface of the circuit board 12 made of metal such as aluminum is covered with an insulative layer 44. The insulative layer 44 is made of epoxy resin or the like highly filled with filler such as $AL_2O_3$ in an amount of about 60% by weight to 80% by weight, for example. A conductive pattern 46 made of metal such as copper and having a thickness of about 50 μm is formed on the upper surface of the insulative layer 44. The island portion 28 of the lead is fixedly attached on the upper surface of the conductive pattern 46 with an adhesive 48 such as solder provided therebetween. Thus, the heat generated by the transistor 22 during operation is radiated outside through the island portion 28, the adhesive 48, the conductive pattern 46, and the circuit board 12.

In FIG. 3B no conductive pattern is formed on the upper surface of the insulative layer 44. The lower surface of the island portion 28 is fixedly attached on the upper surface of the insulative layer 44 with the conductive or insulative adhesive 48 provided therebetween.

With reference to FIG. 4A, a structure in which the lead 20 is connected to the control board 14 is described. The inner end of the lead 20 is branched into the supporting portion 38 and the bonding portion 36. The supporting portion 38 is formed by bending processing to be disposed on the upper side while the bonding portion 36 is formed by bending processing to be disposed on the lower side. The bonding portion 36 is connected to the control electrode of the transistor 22 through the fine metal wire 26. The supporting portion 38 is connected to the control board 14.

Specifically, the conductive pattern 50 is formed on the upper surface of the control board 14 made of an insulative material such as a glass epoxy resin. Also, a conductive pattern 52 in a pad-shape is formed on the lower surface thereof. The conductive pattern 50 on the upper surface and the conductive pattern 52 on the lower surface are connected with each other through a penetrating electrode 54 penetrating through the control board 14. The conductive pattern 52 provided on the lower surface of the control board 14 is connected to the supporting portion 38 with the conductive adhesive interposed therebetween. Thus, the control element 42 mounted on the upper surface of the control board 14 and the transistor 22 provided on the upper surface of the circuit board 12 are connected to each other through the lead 20. Accordingly, the transistor 22 performs switching operation based on a control signal supplied from the control element 42.

Referring to FIG. 4B, the supporting portion 38 of the lead 20 and the control board 14 may be connected to each other through the fine metal wire 26. Specifically, one end of the fine metal wire 26 is connected to the conductive pattern 50 disposed on the upper surface of the control board 14, while the other end of the fine metal wire 26 is connected to the upper surface of the supporting portion 38. In this structure, the conductive pattern needs not to be provided on the back surface of the control board 14 and no penetrating electrode penetrating the control board 14 is needed.

Figure 5:
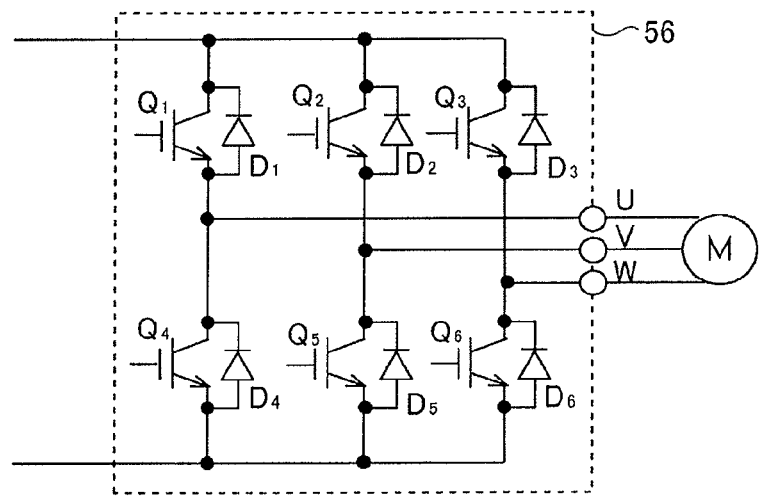
FIG. 5 is a diagram showing the circuit device according to the preferred embodiment of the invention.
Figure 5:
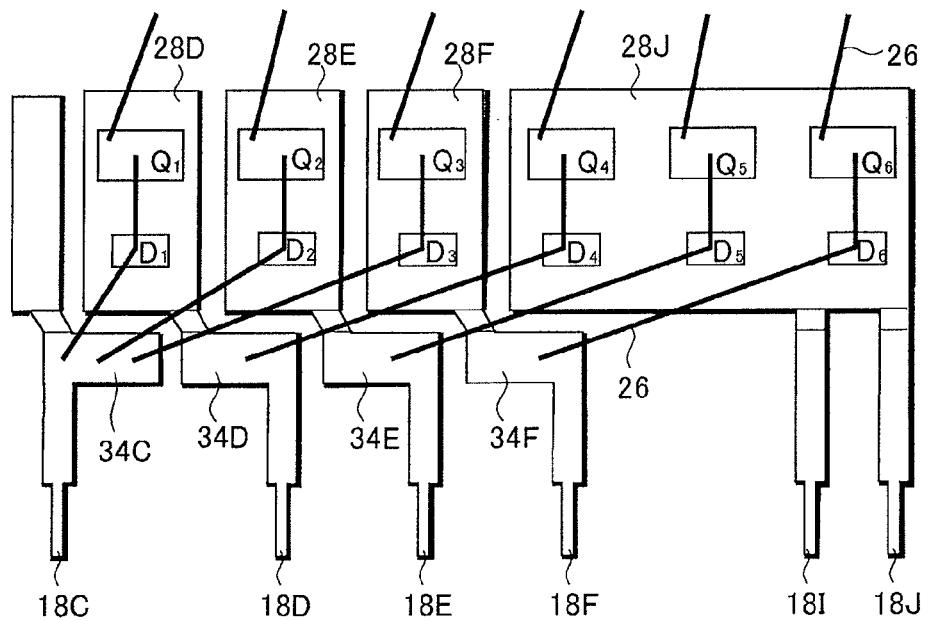
Figure 5:
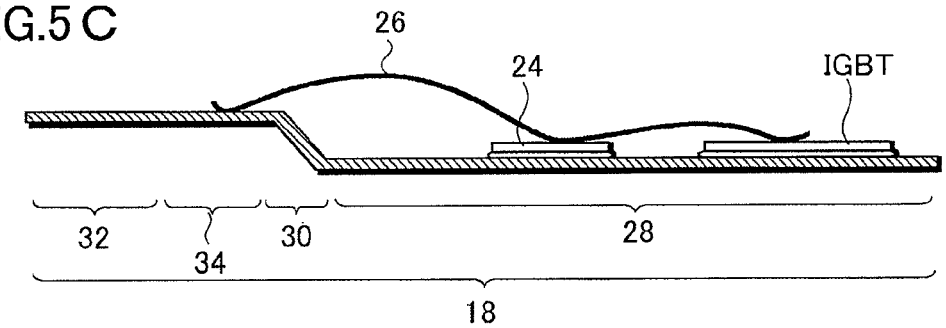

Referring to FIG. 5, a case where the three phase inverter circuit is incorporated in the hybrid integrated circuit device 10 is described. FIG. 5A is a circuit diagram of the inverter circuit. FIG. 5B is a plan view showing a structure of the leads. FIG. 5C is a cross-sectional view of the lead 18.

Referring to FIG. 5A, the inverter circuit 56 includes six IGBTs (Q1 to Q6) and six diodes (D1 to D6). The IGBTs Q1 to Q3 are high side transistors while the IGBTs Q4 to Q6 are low side transistors. The flywheel diodes (D1 to D6) are connected to the collector electrode and the emitter electrode of the respective IGBTs (Q1 to Q6) in inverse parallel. By thus connecting the flywheel diodes with the IGBTs in inverse parallel, the IGBTs are prevented from being broken by an over voltage due to counter electromotive force generated in an inductive load.

With this structure, the inverter circuit 56 converts received direct-current power into alternate-current power of three phases (U, V, W) which rotationally drives a motor M as a load.

The IGBTs (Q1) and (Q4) are serially connected and exclusively ON/OFF controlled. The alternate-current power of U phase is outputted to the outside from the midpoint of the IGBTs (Q1) and (Q4) through the lead. The IGBTs (Q2) and (Q5) are serially connected and the alternate-current power of V phase is outputted to the outside from the midpoint of the IGBTs (Q2) and (Q5) that are exclusively ON/OFF controlled. The IGBTs (Q3) and (Q6) are serially connected and the alternate-current power of W phase is outputted to the outside from the midpoint of the IGBTs (Q3) and (Q6) that are exclusively ON/OFF controlled. Switching of the IGBTs is controlled by the control element 42 shown in FIG. 1B.

Referring to FIG. 5B, the IGBTs and the diodes are fixedly attached on the upper surfaces of the island portions 28D to 28J of the leads 18D to 18J with a conductive adhesive such as solder. Specifically, the IGBT (Q1) and the diode D1 are mounted on the island portion 28D of the lead 18D, while the IGBT (Q2) and the diode D2 are mounted on the island portion 28E of the lead 18E. The IGBT (Q3) and the diode D3 are mounted on the island portion 28F of the lead 18F, while three IGBTs (Q4 to Q6) and three diodes D4 to D6 are mounted on the island portion 28J of the lead 18J. A collector electrode formed on the back surface of each IGBT and a cathode electrode of each diode are connected to the upper surface of a corresponding island portion with a conductive adhesive such as solder.

The transistors and the diodes mounted on the island portions are connected with each other through the fine metal wires to form the inverter circuit. In this embodiment, the transistor and the diode mounted on each island are connected with a bonding portion of an adjacent lead through a fine metal wire.

Specifically, the IGBT (Q1) and the diode D1 mounted on the island portion 28D of the lead 18D respectively have an emitter electrode and an anode electrode connected to a bonding portion 34C of the lead 18C through the fine metal wire 26. The IGBT (Q2) and the diode D2 mounted on the island portion 28E of the lead 18E respectively have an emitter electrode and an anode electrode connected to a bonding portion 34D of the lead 18D through the fine metal wire 26. The IGBT (Q3) and the diode D3 mounted on the island portion 28F of the lead 18F respectively have an emitter electrode and an anode electrode connected to a bonding portion 34E of the lead 18E through the fine metal wire 26.

Moreover, the IGBTs (Q4 to Q6) and the diodes D4 to D6 mounted on the island portion 28J connected to the negative side of a direct-current power source are connected to the respective bonding portions 34D to 34F of the leads 18D to 18F. Specifically, an emitter electrode of the IGBT (Q4) and an anode electrode of the diode D4 are connected to the bonding portion 34D of the lead 18D through the fine metal wire 26. An emitter electrode of the IGBT (Q5) and an anode electrode of the diode D5 are connected to the bonding portion 34E of the lead 18E through the fine metal wire 26. An emitter electrode of the IGBT (Q6) and an anode electrode of the diode D6 are connected to the bonding portion 34F of the lead 18F through the fine metal wire 26.

In this embodiment, the adjacent leads are connected with each other through the fine metal wires. The fine metal wire 26 connecting the IGBT (Q4) and the diode D4 with the bonding portion 34D of the lead 18D is formed to pass above the leads 18E and 18F. If the leads 18C to 18J are entirely flat, the fine metal wires 26 formed in such a complex manner may contact with each other and cause short circuiting. In this embodiment, the bonding portion 34 to which the fine metal wire is connected is positioned at a higher position than the island portion 28 with the slope portion 30 provided therebetween as shown in FIG. 5. Thus, the fine metal wires formed in a complex manner to form the inverter circuit are prevented from being in contact and causing short circuiting.

Furthermore, in this embodiment, no conductive pattern is formed on the upper surface of the circuit board 12 and the transistor 22 and the diode 24 are mounted on the island portion 28 of the lead 18 placed on the upper surface of the circuit board 12 as shown in FIG. 1B. Thus, the leads 18 of the present embodiment not only serve as external output terminals but also serve as the conductive pattern in Description of the Related Art. The island portion 28 of the lead 18 has a thickness of about 500 μm, for example, and thus is formed to have a thickness larger than that (50 μm) of the conductive pattern formed on the upper surface of the circuit board described in Description of the Related Art. The thin conductive pattern is formed over a wide area to deal with a large current of about several tens of amperes in the conventional case. In the present embodiment however, the lead 18 is thick and thus has a large cross-sectional area. Thus the area occupied by the lead 18 can be made smaller compared with the conventional conductive pattern. This contributes to the downsizing of the device as a whole.

In addition, referring to FIG. 1B, the control element 42 for controlling the operation of the transistor 22 disposed on the circuit board 12 is disposed on the control board 14 provided separately from the circuit board 12 in this embodiment. This structure can thermally separate the transistor 22 that becomes high temperature during operation from the control element 42. Moreover, the heat generated by the transistor 22 is favorably radiated outside through the circuit board 12 made of metal in this embodiment. Thus, the control element 42 can be prevented from being overheated by the heat generated by the transistor 22.

Next, a method of manufacturing the hybrid integrated circuit device 10 having the above described structure is described with reference to FIG. 6 to FIG. 8.

Figure 6:
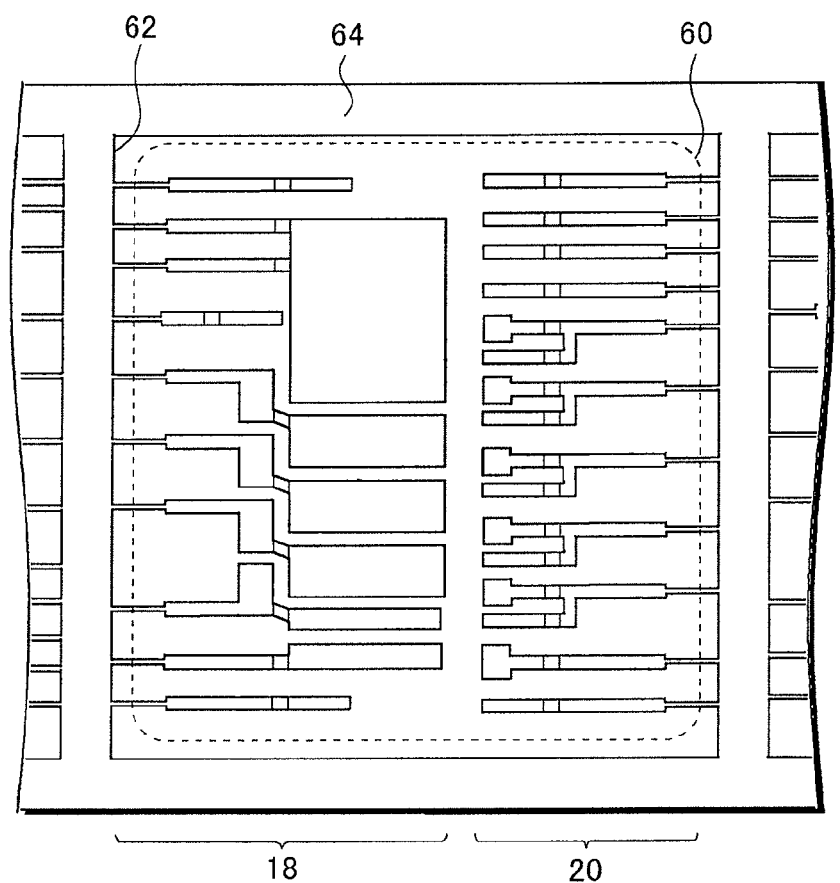
FIG. 6 is a diagram showing a method for manufacturing the circuit device according to the preferred embodiment of the invention.
Figure 6B:
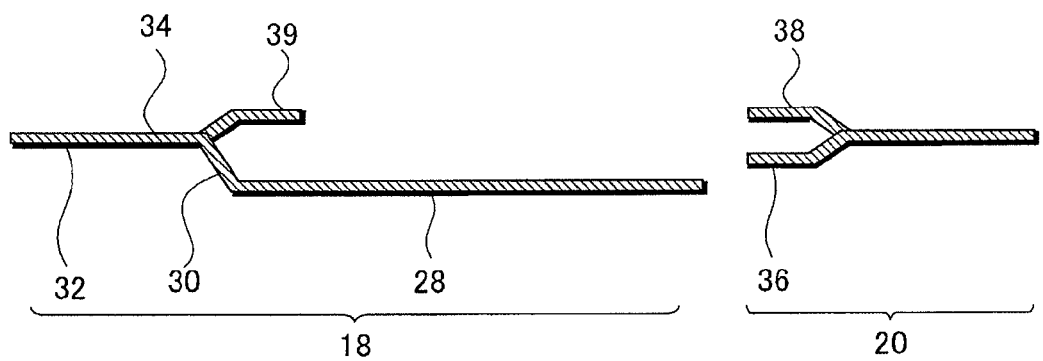
FIG. 6B is a cross-sectional view.

Referring to FIG. 6, first of all, a lead frame 58 including multiple leads 18 and 20 are prepared. FIG. 6A is a plan view showing one unit 60 to be provided in the lead frame 58. FIG. 6B is a cross-sectional view of the unit 60.

Referring to FIG. 6A, the unit 60 includes a large number of leads 18 and 20 forming a single hybrid integrated circuit device. Each of the leads 18 and 20 has one end positioned in an area on which the circuit board 12 is to be placed. The leads 18 are disposed on the left side of the unit 60 in the drawing and are provided with the island portions 28 on which the transistors and the diodes are mounted as described above. The leads 20 are disposed on the right side in the drawing and serve as external connection terminals and also are responsible for the connection of the control electrode of the transistor and mechanically supporting the control board.

The lead frame 58 includes a plurality of the units 60 having the structure within a frame-shaped outer frame 64. The following steps are collectively performed on the units 60.

As shown in FIG. 6B, the lead 20 has a slope portion formed by bending processing at an intermediate portion. The supporting portion 38 to support the control board is formed at the inner end portion of the lead 20. The bonding portion 36 to be connected to the control electrode of the transistor to be mounted thereafter is also formed at the end portion of the lead 20. The lead 18 on the left side in the drawing also has the slope portion 30 formed by bending processing by press work at an intermediate portion. The bonding portion 34 for wire bonding is formed between the slope portions 30 and the lead portion 32.

Figure 7A:
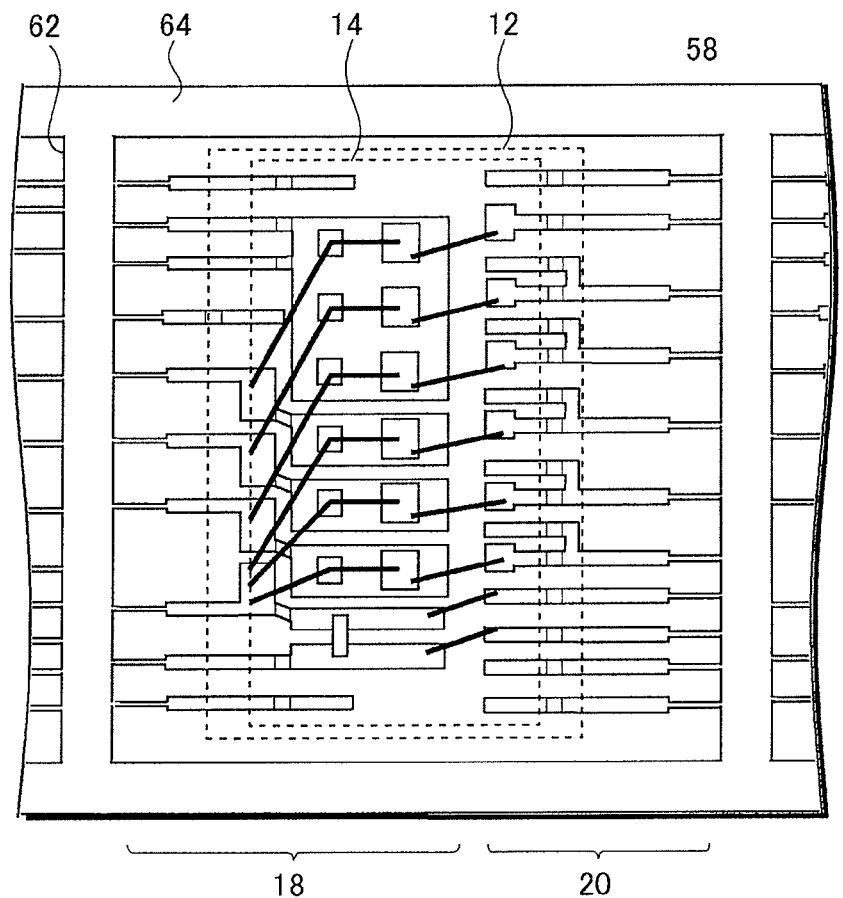
FIG. 7A is a plan view.
Figure 7B:
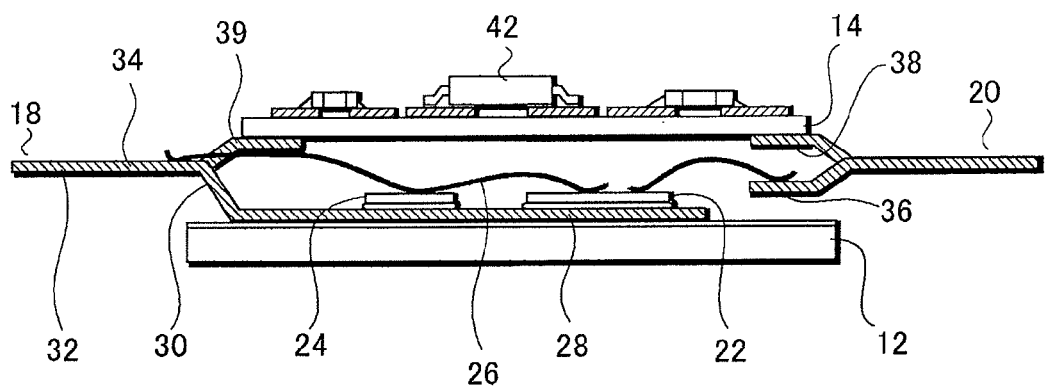
FIG. 7B is a cross-sectional view.

Referring to FIG. 7, the circuit elements, and the boards are fixedly attached on the leads. FIG. 7A is a plan view showing the present step and FIG. 7B is a cross-sectional view. In FIG. 7A, areas on which the circuit board 12 and the control board 14 are to be disposed are defined by dotted lines.

Specifically, the back surface electrode of the transistor 22 is fixedly attached on the island portion 28 of the lead 18 with a conductive adhesive such as solder. The back surface electrode of the diode 24 is fixedly attached in a similar manner. Then, the electrode of the transistor 22 is connected to the bonding portion 34 provided at the intermediate portion of the lead 18 through the fine metal wire 26. Similarly, the control electrode (gate electrode) of the transistor 22 is connected to the bonding portion 36 of the lead 20 through the fine metal wire 26.

Referring to FIG. 7B, the island portion 28 of the lead 18 is fixedly attached on the upper surface of the circuit board 12. The lower surface of the island portion 28 may be fixedly attached on the upper surface of the circuit board 12 as follows. Specifically, the island portion 28 may be fixedly attached on the conductive pattern 46 formed on the upper surface of the circuit board 12 as shown in FIG. 3A or may be directly fixedly attached on the upper surface of the insulative layer 44 covering the upper surface of the circuit board 12 as shown in FIG. 3B.

The control board 14 is fixedly attached on a supporting portion 39 of the lead 18 and the supporting portion 38 of the lead 20. The supporting portion 38 of the lead 20 and the conductive pattern formed on the main surface of the control board 14 are electrically connected with each other. The structure in which the supporting portion 38 and the control board 14 are connected is as shown in FIG. 4. In such a structure, the circuit board 12 and the control board 14 are fixed in the lead frame 58.

Figure 8:
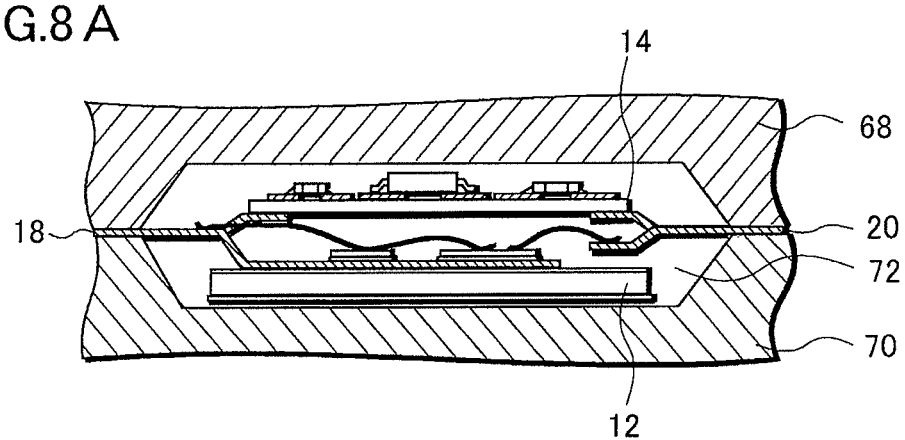
FIG. 8 is a diagram showing the method for manufacturing the circuit device according to the preferred embodiment of the invention.
Figure 8:
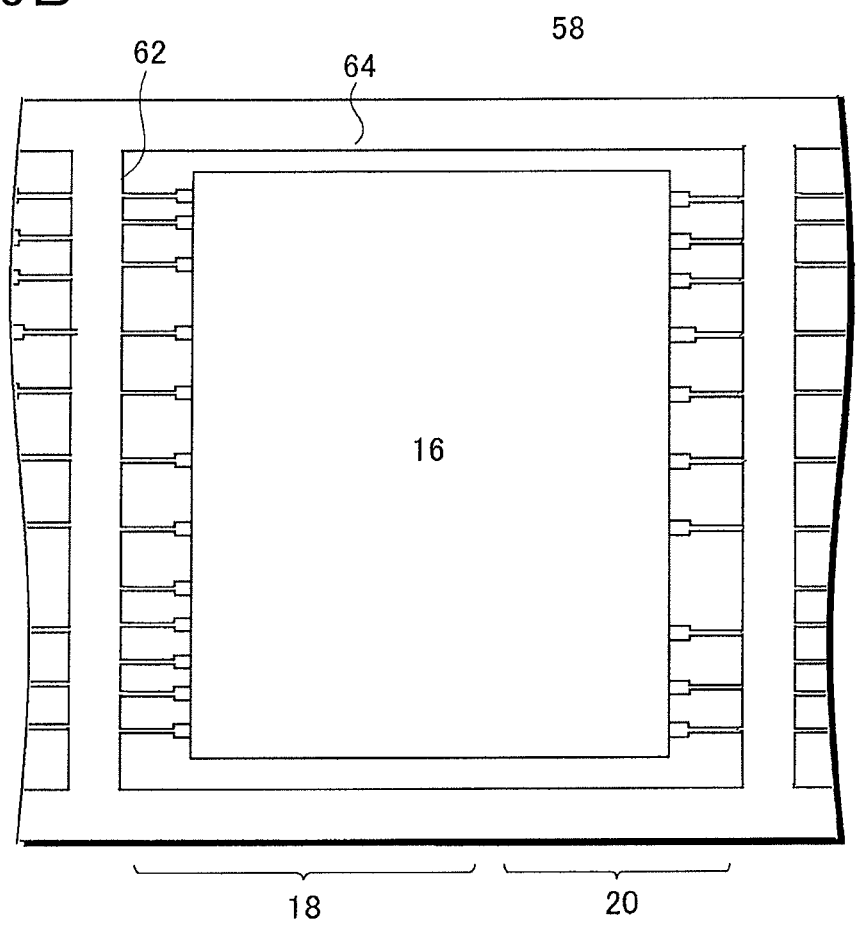
Figure 9:
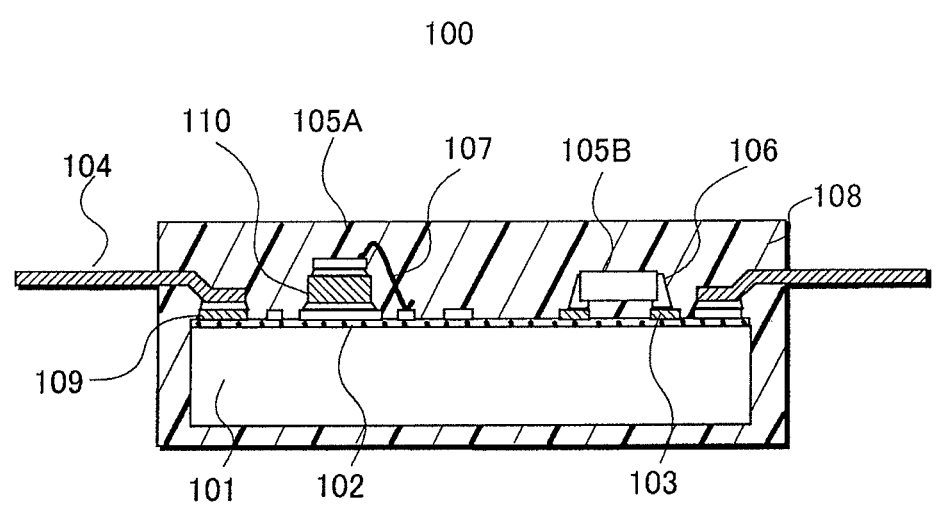
FIG. 9 is a cross-sectional view of a hybrid integrated circuit device described in Description of the Related Art.

Referring to FIG. 8, next, an encapsulating resin is formed to cover the circuit board 12 and the control board 14. FIG. 8A is a cross-sectional view showing a step of molding the circuit board 12 using a mold. FIG. 8B is a plan view of the lead frame 58 after the molding.

Referring to FIG. 8A, the circuit board 12 and the control board 14 fixed to the lead frame are placed in a cavity 72 defined by an upper mold 68 and a lower mold 70. Here, the positions of the circuit board 12 and the control board 14 in the cavity 72 are fixed by clamping the leads 18 and 20 with the upper mold 68 and the lower mold 70. Then, the circuit board 12, the control board 14 and the circuit elements and the like are encapsulated by injecting resin into the cavity 72 through a gate provided to the mold. In this step, transfer molding using a thermosetting resin or injection molding using a thermoplastic resin is performed. The encapsulating structure of the circuit board 12 is not limited to the resin encapsulation and an encapsulation by potting or an encapsulation using a case member may also be employed.

Referring to FIG. 8B, after the molding step is completed, the leads 18 and 20 are separated from the lead frame 58 by press work. Specifically, the leads 18 and 20 are individually separated at a portion at which a tie bar 62 is provided. Thus, the hybrid integrated circuit device as shown in FIG. 1 is separated from the lead frame 58.

According to the present invention, the first circuit element that is a transistor performing switching of a large current for example is mounted on the first substrate. The second substrate on which the second circuit element that controls the semiconductor element is mounted is disposed to overlap with the first substrate. Thus, the first circuit element that generates a large amount of heat and the second circuit element that controls the first circuit element can be incorporated in a single circuit device.

Moreover, according to the present invention, the first circuit element is mounted on the upper surface of the island portion which is a portion of the lead and the lower surface of the island portion is fixedly attached on the upper surface of the first substrate. Thus, the large current passing through the first circuit element can be taken out without passing through the conventional conductive pattern. Thus, no wide conductive pattern is formed on the upper surface of the first substrate, whereby the device as a whole can be downsized.

What is claimed is:

1. A circuit device comprising:
    a first substrate;
    a lead comprising a lead portion, a bonding portion and an island portion, the island portion being attached to an upper surface of the first substrate;
    a first circuit element mounted on the island portion of the lead;
    a second substrate disposed above and overlapping the first substrate;
    a second circuit element mounted on the second substrate so as to be electrically connected to the first circuit element through the lead; and
    an encapsulating resin covering the first substrate, the second substrate, the first circuit element, the second circuit element, the bonding portion and the island portion, the lead portion of the lead not being covered by the encapsulating resin, wherein
    the bonding portion is elevated from a surface of the island portion, and is connected to a wiring that is connected to the first circuit element.

2. The circuit device of claim 1, wherein a lower surface of the first substrate is not covered by the encapsulating resin so as to be exposed to an outside ambience.

3. The circuit device of claim 1, wherein the first circuit elements is a transistor for an inverter circuit, and the second circuit element is a control element that controls switching of the transistors.

4. A circuit device comprising:
    a first substrate having a first side and a second side;
    a plurality of first leads disposed along the first side of the first substrate and each comprising a lead portion and an island portion which is attached to an upper surface of the first substrate;
    a plurality of first circuit elements mounted on the island portions of the first leads;
    a second substrate disposed above and overlapping the first substrate;
    a plurality of second leads disposed along the second side of the first substrate;
    a plurality of second circuit elements mounted on the second substrate so as to be electrically connected to corresponding first circuit elements through the second leads; and
    an encapsulating resin covering the first substrate, the second substrate, the first circuit elements, the second circuit elements and the island portions, the lead portions of the first leads not being covered by the encapsulating resin.

5. The circuit device of claim 4, wherein at least one of the first leads comprises a first bonding portion disposed between the lead portion and the island portion, the first bonding portion being elevated from a main surface of the first substrate and being electrically connected to a corresponding first circuit element through a wiring.

6. The circuit device of claim 4, wherein an inner end of at least one of the second leads is separated into a second bonding portion electrically connected to a corresponding first circuit element and a supporting portion that supports the second substrate.

7. The circuit device of claim 6, wherein the second bonding portion is disposed away from the main surface of the first substrate.

8. The circuit device of claim 5, wherein a first circuit element is electrically connected to a first bonding portion of another of the first leads through a wiring.

9. The circuit device of claim 4, wherein a lower surface of the first substrate is not covered by the encapsulating resin so as to be exposed to an outside ambience.

10. The circuit device of claim 4, wherein some of the first circuit elements are transistors for an inverter circuit, and some of the second circuit elements are control elements that control switching of the transistors.

11. A method of manufacturing a circuit device, comprising:
- providing a lead frame comprising a plurality of leads, some of the leads comprising respective island portions and bonding portions;
- mounting a first circuit element on an upper surface of each of the island portions;
- attaching lower surfaces of the island portions to an upper surface of a first substrate;
- placing a second substrate on which second circuit elements are mounted over the first substrate so that the second substrate is mechanically supported by the leads; and
- encapsulating the first substrate, the first circuit elements, the second substrate and the second circuit elements by a resin, wherein
- the bonding portion of a lead is elevated from a surface of the corresponding island portion, and is connected to a wiring that is connected to the first circuit element.

12. The method of claim 9, wherein some portions of leads are not covered by the resin, the first circuit elements are electrically connected to another portions of the leads through wirings, and the another portions of the leads are elevated from the island portions.

* * * * *